United States Patent
Jiang et al.

(10) Patent No.: US 7,403,050 B2
(45) Date of Patent: Jul. 22, 2008

(54) CIRCUITS FOR QUICKLY GENERATING POWER GOOD SIGNALS TO MOTHERBOARD

(75) Inventors: Wu Jiang, Shenzhen (CN); Yong-Zhao Huang, Shenzhen (CN); Yun Li, Shenzhen (CN)

(73) Assignees: Hong Fu Jin Precision Industry (Shenzhen) Co., Ltd., Bao-an District, Shenzhen, Quangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 54 days.

(21) Appl. No.: 11/321,194

(22) Filed: Dec. 29, 2005

(65) Prior Publication Data
US 2006/0145731 A1    Jul. 6, 2006

(30) Foreign Application Priority Data
Dec. 30, 2004    (CN)    ................... 2004 1 0091967

(51) Int. Cl.
*H03L 7/00*    (2006.01)

(52) U.S. Cl. ..................... 327/143; 327/198
(58) Field of Classification Search ................ 327/143, 327/198
See application file for complete search history.

(56) References Cited

U.S. PATENT DOCUMENTS

| 5,450,417 | A | | 9/1995 | Truong et al. ............... 327/198 |
| 5,852,377 | A | * | 12/1998 | Pitsch ......................... 327/143 |
| 6,876,237 | B2 | * | 4/2005 | Lee et al. .................... 327/143 |
| 7,256,778 | B1 | * | 8/2007 | Choi .......................... 345/213 |

* cited by examiner

*Primary Examiner*—Kenneth B. Wells
(74) *Attorney, Agent, or Firm*—Morris Manning Martin LLP; Tim Tingkang Xia, Esq.

(57) ABSTRACT

A power good signal generating circuit includes an NPN transistor, a first resistor, a second resistor, a third resistor, a first power source, and a second power source. The first resistor is connected between a base of the transistor and the first power source. The second resistor is connected between a collector of the transistor and the second power source. The third resistor is connected between an emitter of the transistor and ground. The collector is connected to an output for sending a PG signal and the emitter is connected to an input for receiving a control signal P.

8 Claims, 3 Drawing Sheets

CIRCUITS FOR QUICKLY GENERATING POWER GOOD SIGNALS TO MOTHERBOARD

BACKGROUND OF THE INVENTION

1. Field of the Invention

The present invention relates to signal generating circuits, and particularly to a circuit which can quickly generate a PG (power good) signal to a motherboard.

2. General Background

An electronic device such as a computer generally includes many circuits to control apparatuses or elements installed in the computer. When a function is executed, relating circuits must respectively work and respond in a predetermined order in response to certain indicating signals. For example, in a motherboard of the computer, a PG (power good) signal is a signal informing the motherboard that a corresponding apparatus or element is ready for work.

Referring to FIG. 3, a conventional PG signal generating circuit includes a first transistor Q200, a second transistor Q300, an input Pin connected to a base of the first transistor Q200, an output Pout connected to a collector of the second transistor Q300, a first power supply Vcc12 connected to a collector of the first transistor Q200, a second power supply Vcc22 connected to a collector of the second transistor Q300, and the emitters of the first and second transistors Q200 and Q300 are grounded. When a control signal P (high level) is received by the input Pin, the first transistor Q200 turns on and the second transistor Q300 turns off and a PG signal (high level) is sent from the output Pout. However, the more electronic elements there are, the more control signals P there are sent to the PG signal generating circuit which slows the generation of PG signals.

What is desired, therefore, is circuit which can quickly generate a PG signal.

SUMMARY

In a preferred embodiment, a circuit generating a PG signal to a motherboard includes an NPN transistor, a first resistor, a second resistor, a third resistor, a first power source, and a second power source. The first resistor is connected between a base of the transistor and the first power source. The second resistor is connected between a collector of the transistor and the second power source. The third resistor is connected between an emitter of the transistor and ground. The collector is connected to an output for sending a PG signal and the emitter is connected to an input for receiving a control signal. It is economic and quick to use the circuit to generate a PG signal.

Other advantages and novel features will become more apparent from the following detailed description when taken in conjunction with the accompanying drawings, in which:

DETAILED DESCRIPTION OF THE EMBODIMENT

Figure 1:
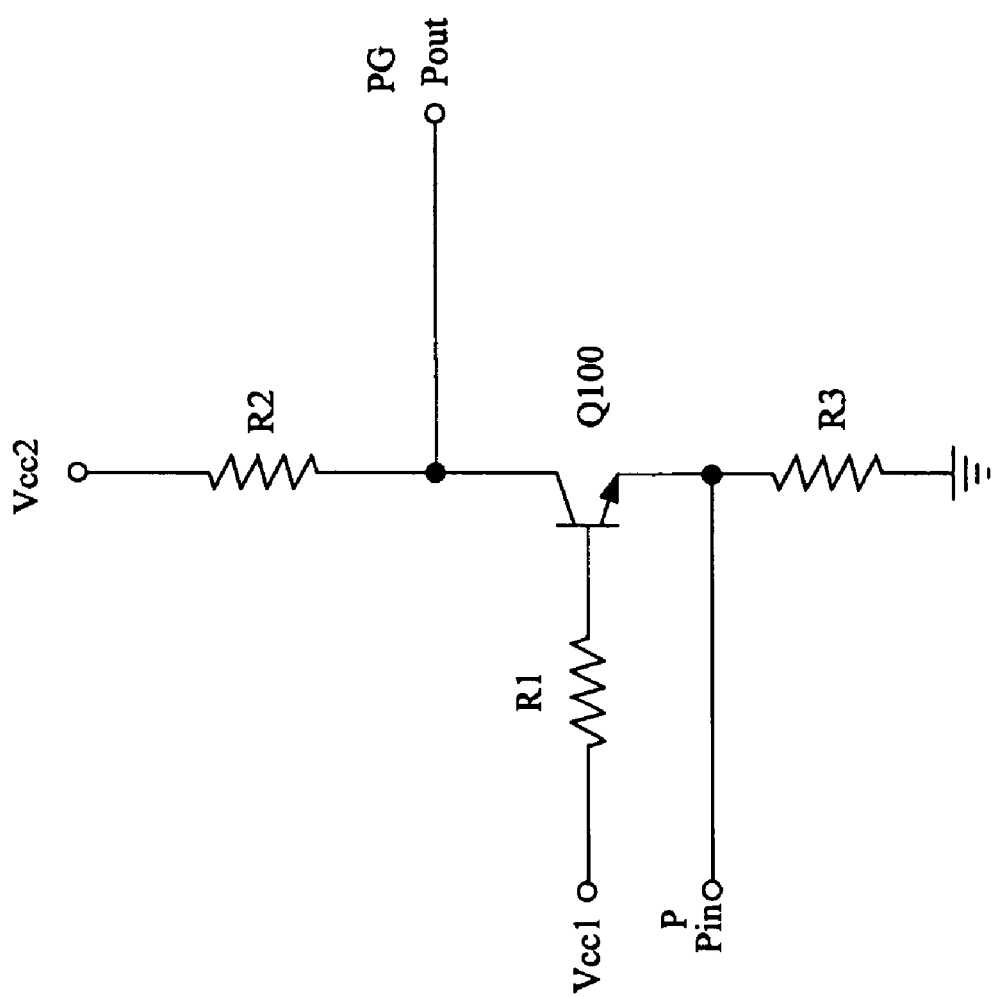
FIG. 1 is a circuit diagram of a signal generating circuit in accordance with a preferred embodiment of the present invention.

Referring to FIG. 1, a circuit for generating a PG signal as an identification signal for an electronic part like a motherboard in accordance with a preferred embodiment of the present invention includes a switching transistor Q100, a first resistor R1, a second resistor R2, a third resistor R3, a first power source Vcc1, and a second power source Vcc2. The switching transistor Q100 includes three terminals. In this preferred embodiment, the switching transistor Q100 is an NPN triode transistor. The switching transistor Q100 can also be an N-channel MOSFET. The switching transistor Q 100 includes a collector as the first terminal, an emitter as the second terminal, and a base as the third terminal. The first resistor R1 is connected between the base of the transistor Q100 and the first power source Vcc1. The second resistor R2 is connected between the collector of the transistor Q100 and the second power source Vcc2. The third resistor R3 is connected between the emitter of the transistor Q100 and ground. The collector of the transistor Q100 is connected to an output Pout and the emitter of the transistor Q100 is connected to an input Pin. Pout is for sending a PG signal to a motherboard. Pin is for receiving a control signal P from an apparatus.

While providing the first power source Vcc1 with a 1.5V voltage and the second power source Vcc2 with a 3.3V voltage, when the input Pin receives a control signal P (high level), the transistor Q100 is turned off, and the collector of the transistor Q100 outputs a PG signal to the motherboard. When the input Pin receives a control signal P (low level), the transistor Q100 is turned on, and no signal output from the output Pout.

Figure 2:
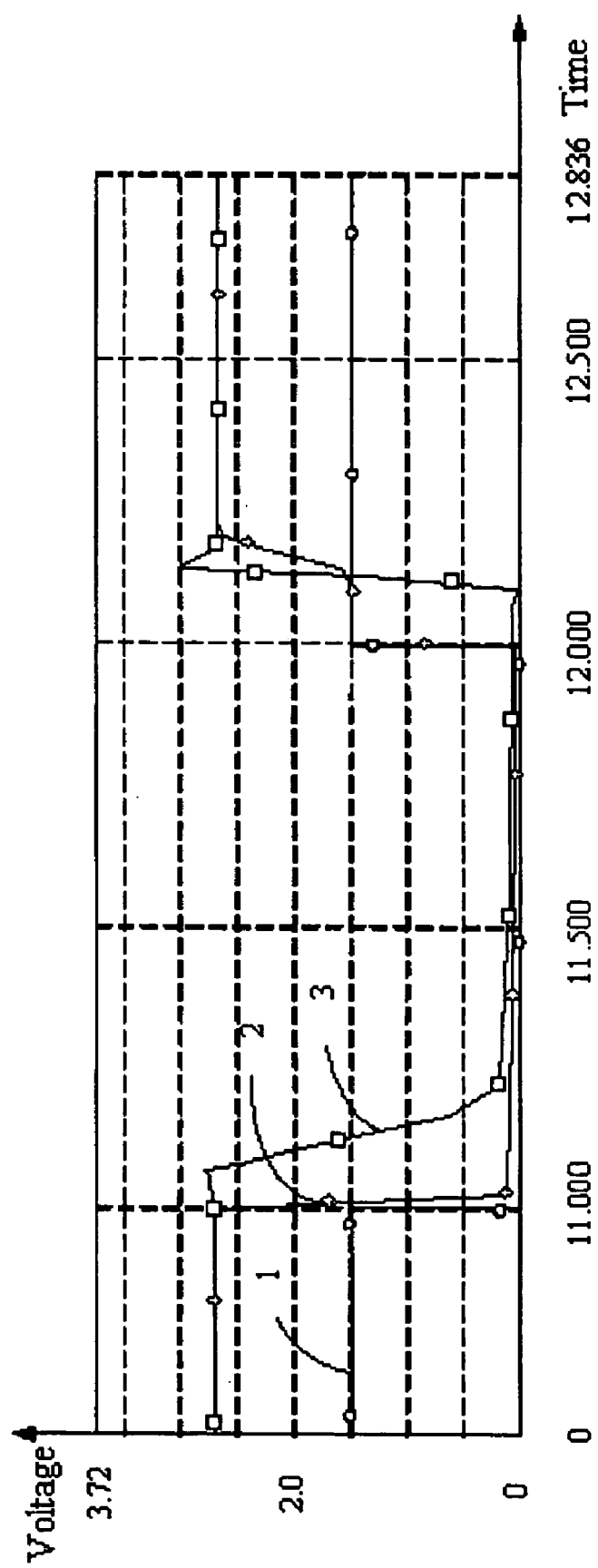
FIG. 2 is a graph of voltage output from the signal generating circuit of FIG. 1 contrasted with that of a conventional signal generating circuit as in FIG. 3.
Figure 3:
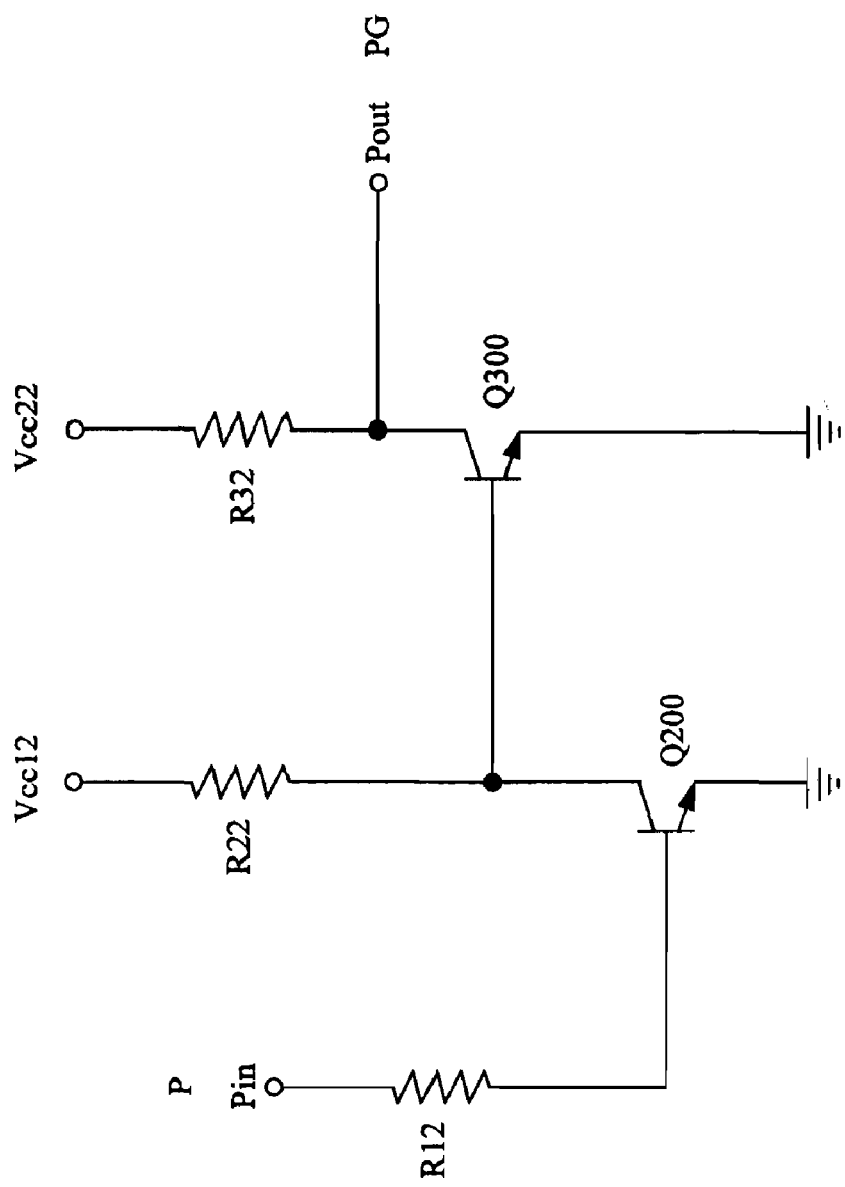
FIG. 3 is a conventional PG signal generating circuit.

A signal takes longer to pass through a circuit having many electronic components, because of the inherent electrical and mechanical characteristics of the electronic components. The circuit of the present invention only includes one switching transistor Q100 and so has less electronic components than that of the conventional circuit. Accordingly, the control signals P passing through the present circuit will be less delayed than when passing through the conventional circuit. Referring to FIG. 2, a waveform 1 stands for the control signal P, a waveform 2 stands for an output of the circuit of the preferred embodiment of the present invention, and a waveform 3 stands for an output of the conventional circuit. The waveform 3 lags far behind the waveforms 1 and 2.

It is believed that the present embodiment and its advantages will be understood from the foregoing description, and it will be apparent that various changes may be made thereto without departing from the spirit and scope of the invention or sacrificing all of its material advantages, the example hereinbefore described merely being a preferred or exemplary embodiment of the invention.

What is claimed is:

1. A circuit for generating a power good signal to a motherboard, the circuit comprising:
    a first power source;
    a second power source;
    a switching transistor comprising a first terminal connected to an input for receiving a control signal, a second terminal connected to an output for sending the power good signal, and a third terminal;
    a first resistor connected between earth and the first terminal of the switching transistor;
    a second resistor connected between the second power source and the second terminal of the switching transistor; and a third resistor connected between the first power source and the third terminal of the transistor.

2. The circuit as claimed in claim 1, wherein the switching transistor is an NPN triode transistor.

3. The circuit as claimed in claim 2, wherein the transistor comprises a base connecting the third resistor to the first power source, a collector connecting the second resistor to the second power source, and an emitter connecting the first resistor to earth.

4. The circuit as claimed in claim 3, wherein the input is connected to the emitter of the transistor, the output is connected to the collector of the transistor.

5. The circuit as claimed in claim 1, wherein the first power source provides a 1.5 voltage.

6. The circuit as claimed in claim 1, wherein the second power source provides a 3.3 volt voltage.

7. A circuit for generating a power good signal to a motherboard comprising:
  an input for receiving a control signal;
  an output for sending a power good signal;
  a first power source;
  a first resistor;
  a switching transistor comprising a first terminal connected to the input, a second terminal connected to the output, and a third terminal connected to the first power source via the first resistor, the switching transistor being an NPN triode transistor and comprising an emitter as the first terminal, a collector as the second terminal, and a base as the third terminal;
  a second power source connected to the output;
  a second resistor connected between the emitter of the switching transistor and earth; and
  a third resistor connected between the second power source and the collector; wherein the first resistor is connected between the first power source and the base.

8. The circuit as claimed in claim 7, wherein the first power source provides a 1.5V voltage, and the second power source provides a 3.3V voltage.

* * * * *